US010950588B2

(12) United States Patent
Yu et al.

(10) Patent No.: US 10,950,588 B2
(45) Date of Patent: Mar. 16, 2021

(54) CHIP PACKAGE STRUCTURE AND MANUFACTURING METHOD THEREOF

(71) Applicant: Industrial Technology Research Institute, Hsinchu (TW)

(72) Inventors: Cheng-Hung Yu, Taoyuan (TW); Tai-Jui Wang, Kaohsiung (TW); Chieh-Wei Feng, Taoyuan (TW); Wei-Yuan Cheng, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 74 days.

(21) Appl. No.: 16/027,374

(22) Filed: Jul. 5, 2018

(65) Prior Publication Data
US 2019/0341373 A1 Nov. 7, 2019

(30) Foreign Application Priority Data
May 7, 2018 (TW) .................................. 107115470

(51) Int. Cl.
*H01L 25/16* (2006.01)
*H01L 23/31* (2006.01)
(Continued)

(52) U.S. Cl.
CPC .......... *H01L 25/16* (2013.01); *H01L 21/4853* (2013.01); *H01L 21/4857* (2013.01); *H01L 21/565* (2013.01); *H01L 21/568* (2013.01); *H01L 23/3121* (2013.01); *H01L 23/5383* (2013.01); *H01L 23/5386* (2013.01);
(Continued)

(58) Field of Classification Search
None
See application file for complete search history.

(56) References Cited

U.S. PATENT DOCUMENTS 9,147,585 B2  9/2015 Kilger et al.
9,735,112 B2  8/2017 Constantino et al.
(Continued)

FOREIGN PATENT DOCUMENTS

CN  103000625  1/2016
TW  200929480  7/2009
(Continued)

OTHER PUBLICATIONS

Office Action of Taiwan Counterpart Application, dated Nov. 14, 2018, pp. 1-5.
"Office Action of Taiwan Counterpart Application," dated Mar. 27, 2019, p. 1-p. 5.

*Primary Examiner* — Mounir S Amer
(74) *Attorney, Agent, or Firm* — JCIPRNET

(57) ABSTRACT

A chip package structure including a redistribution structure layer, at least one chip, and an encapsulant is provided. The redistribution structure layer includes at least one redistribution circuit, at least one transistor electrically connected to the redistribution circuit, and a plurality of conductive vias electrically connected to the redistribution circuit and the transistor. The chip is disposed on the redistribution structure layer and electrically connected to the redistribution structure layer. The encapsulant is disposed on the redistribution structure layer and at least encapsulates the chip. A manufacturing method of a chip package structure is also provided.

11 Claims, 10 Drawing Sheets

(51) Int. Cl.
*H01L 23/538* (2006.01)
*H01L 23/60* (2006.01)
*H01L 23/00* (2006.01)
*H01L 25/00* (2006.01)
*H01L 21/48* (2006.01)
*H01L 21/56* (2006.01)
*H01L 29/786* (2006.01)

(52) U.S. Cl.
CPC .......... *H01L 23/5389* (2013.01); *H01L 23/60* (2013.01); *H01L 24/19* (2013.01); *H01L 24/20* (2013.01); *H01L 25/50* (2013.01); *H01L 29/7869* (2013.01); *H01L 29/78666* (2013.01); *H01L 29/78675* (2013.01); *H01L 2224/214* (2013.01); *H01L 2924/1067* (2013.01); *H01L 2924/10253* (2013.01); *H01L 2924/13069* (2013.01); *H01L 2924/1431* (2013.01); *H01L 2924/1434* (2013.01); *H01L 2924/30205* (2013.01)

(56) References Cited

U.S. PATENT DOCUMENTS

| | | |
|---|---|---|
| 2011/0122345 A1* | 5/2011 | Tseng ................ G02F 1/136227 349/106 |
| 2015/0214211 A1 | 7/2015 | Ma et al. |
| 2016/0095221 A1* | 3/2016 | Ramachandran ... H01L 27/1218 361/783 |
| 2016/0247747 A1 | 8/2016 | Janzen et al. |
| 2016/0300817 A1 | 10/2016 | Do et al. |
| 2018/0323126 A1* | 11/2018 | Lin ..................... H01L 27/0266 |
| 2019/0139915 A1* | 5/2019 | Dalmia .................. H01L 23/42 |

FOREIGN PATENT DOCUMENTS

| | | |
|---|---|---|
| TW | I510148 | 11/2015 |
| TW | 201712824 | 4/2017 |
| WO | 2016048753 | 3/2016 |
| WO | 2017048219 | 3/2017 |

* cited by examiner

CHIP PACKAGE STRUCTURE AND MANUFACTURING METHOD THEREOF

CROSS-REFERENCE TO RELATED APPLICATION

This application claims the priority benefit of Taiwan application serial no. 107115470, filed on May 7, 2018. The entirety of the above-mentioned patent application is hereby incorporated by reference herein and made a part of this specification.

BACKGROUND

Technical Field

The disclosure relates to a package structure and a manufacturing method thereof, and also relates to a chip package structure and a manufacturing method thereof.

Description of Related Art

According to the causes of electrostatic discharge (ESD) and how it is discharged to integrated circuits, currently electrostatic discharge may be divided into a human-body model (HBM), a machine model (MM), and a charged-device model (CDM). In order to prevent the integrated circuit from being damaged by electrostatic discharge, it has been proposed to incorporate the design of an electrostatic discharge protection circuit into the integrated circuit. This approach however will increase the complexity of manufacturing of the integrated circuit and raise the production costs. Another approach is to dispose the electrostatic discharge protection circuit on an interposer connected to the chip, but this approach not only increases the manufacturing costs of the interposer, but also increases the overall thickness of the package structure.

In other words, in the chip package structure that has a limited area, using the traditional electrostatic discharge protection design to provide the electrostatic discharge protection function for the chip or the system cannot reduce the manufacturing costs without compromising the size of the chip package structure. Therefore, how to integrate the electrostatic discharge protection function into the chip or system package structure almost without increasing the size of the chip package structure is an issue that needs to be addressed.

SUMMARY

A chip package structure according to an embodiment of the disclosure includes a redistribution structure layer, at least one chip, and an encapsulant. The redistribution structure layer includes at least one redistribution circuit, at least one transistor electrically connected to the redistribution circuit, and a plurality of conductive vias electrically connected to the redistribution circuit and the transistor. The chip is disposed on the redistribution structure layer and electrically connected to the redistribution structure layer. The encapsulant is disposed on the redistribution structure layer and at least encapsulates the chip.

A manufacturing method of a chip package structure according to an embodiment of the disclosure at least includes the following steps. A redistribution structure layer is formed, wherein the redistribution structure layer has a first side and a second side that are opposite to each other. Forming the redistribution structure layer includes forming at least one transistor and a plurality of conductive vias on the first side; and forming at least one redistribution circuit to electrically connect the transistor, wherein the conductive vias are electrically connected to the redistribution circuit and the transistor. The redistribution structure layer is turned to dispose at least one chip on the second side of the redistribution structure layer, wherein the chip and the redistribution structure layer are electrically connected. An encapsulant is formed on the redistribution structure layer to at least encapsulate the chip.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
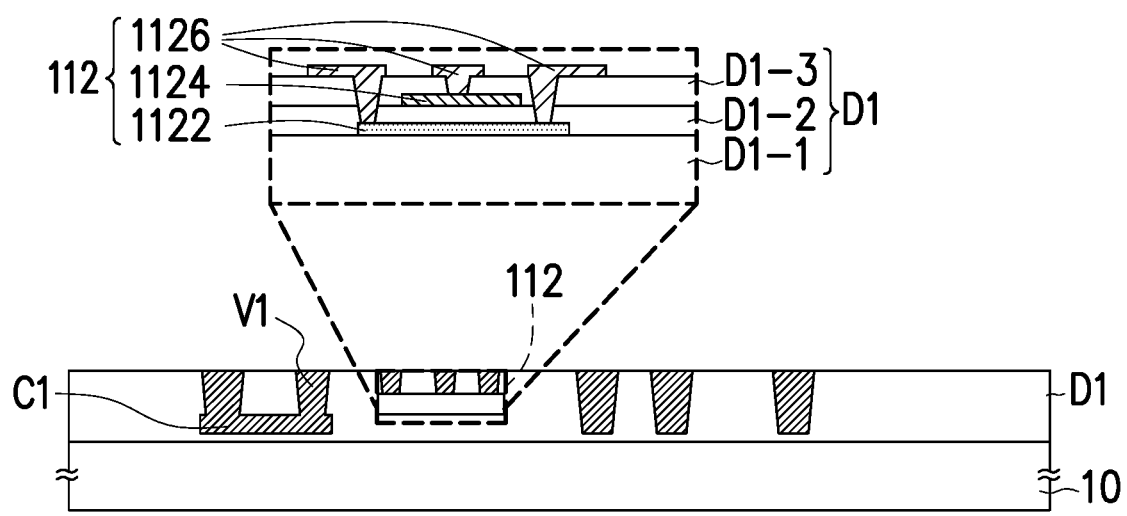
FIG. 1A to FIG. 1H are schematic cross-sectional views showing a manufacturing method of a chip package structure according to the first embodiment of the disclosure.

FIG. 1A to FIG. 1H are schematic cross-sectional views showing a manufacturing method of a chip package structure according to the first embodiment of the disclosure.

FIG. 1A to FIG. 1D illustrate processes of forming a redistribution structure layer 110 on a first carrier 10. The redistribution structure layer 110 may include at least one transistor 112, a plurality of conductive vias 114, and at least one redistribution circuit 116.

First, referring to FIG. 1A, the first carrier 10 is provided, wherein the first carrier 10 is, for example, a glass substrate, a silicon substrate, a metal substrate, a plastic substrate, a combination of the foregoing, or other suitable carrier boards.

Next, referring to FIG. 1A again, at least one transistor 112, a first conductive via V1, and a first dielectric layer D1 are formed on the first carrier 10. In some embodiments, a release layer (not shown) may be formed on the first carrier 10 in advance, so as to temporarily fix the redistribution structure layer 110 on the first carrier 10 for separating the first carrier 10 from the redistribution structure layer 110 in the subsequent processes. Furthermore, the first dielectric layer D1 of this embodiment includes a first dielectric sub-layer D1-1, a second dielectric sub-layer D1-2, and a third dielectric sub-layer D1-3 that are stacked sequentially. The transistor 112 includes a semiconductor material layer 1122, a metal material layer 1124, and a conductive material layer 1126.

In some embodiments, the first dielectric sub-layer D1-1 may be formed on the first carrier 10 by spin-on coating, a deposition process, or other suitable manufacturing processes. In some embodiments, the first dielectric sub-layer D1-1 may be deemed as a buffer layer. Next, a semiconductor material may be formed on the first dielectric sub-layer D1-1. For example, the semiconductor material may be made of amorphous silicon (a-Si), low temperature polysilicon (LTPS), or a metal oxide, but not limited thereto. Thereafter, the second dielectric sub-layer D1-2 may be formed on the semiconductor material by deposition or other suitable methods to cover the semiconductor material. Then, a metal material is formed on the second dielectric sub-layer D1-2, and the metal material is patterned to form the metal material layer 1124 of the transistor 112. In some embodiments, the metal material layer 1124 may be deemed as a gate or a control end of the transistor 112. Thereafter, the third dielectric sub-layer D1-3 may be formed on the metal material layer 1124 to cover the metal material layer 1124.

Next, the conductive material layer 1126 of the transistor 112 may be formed. For example, a plurality of openings penetrating through the third dielectric sub-layer D1-3 and the second dielectric sub-layer D1-2 in the thickness direction may be formed by laser drilling or other suitable processes, and the openings may surround a pattern of the metal material layer 1124 and expose a portion of the semiconductor material. In some embodiments, an opening may be formed on the metal material layer 1124 to expose a portion of the metal material layer 1124. Then, the semiconductor material may be doped through these openings so as to form the semiconductor material layer 1122. In some embodiments, the semiconductor material layer 1122 may be deemed as a channel layer of the transistor 112, which may include an undoped region and a doped region. Thereafter, a conductive material may be formed in the openings and on the third dielectric sub-layer D1-3 to be in electrical contact or direct contact with the semiconductor material layer 1122, and the conductive material layer 1126 surrounds the metal material layer 1124. In some embodiments, the conductive material layer 1126 may also be formed in the opening that exposes a portion of the metal material layer 1124 to be electrically connected to the metal material layer 1124. In some embodiments, the conductive material layer 1126 may be deemed as including a drain and a source, which are respectively connected to and correspond to the doped regions at two ends of the semiconductor material layer 1122. After the conductive material layer 1126 is formed, another dielectric sub-layer may be optionally formed on the conductive material layer 1126 so as to cover the conductive material layer 1126. Here, the embodiment of the disclosure is not intended to limit the number of the dielectric sub-layers.

In some embodiments, a first redistribution circuit C1 may be formed around the transistor 112 in the process of forming the transistor 112 (e.g., after forming the first dielectric sub-layer D1-1, during formation of the metal material layer 1124 of the transistor 112, or in other suitable manufacturing processes of the transistor 112). In some embodiments, the first conductive via V1 electrically connected to the first redistribution circuit C1 may be formed on the first redistribution circuit C1. The first redistribution circuit C1 and the first conductive via V1 may be for vied of the same or similar metal materials, such as copper, aluminum, silver, and an alloy of the foregoing, but not limited thereto. For example, the size of the conductive material layer 1126 of the transistor 112 may be smaller than the size of the first conductive via V1.

Figure 1B:
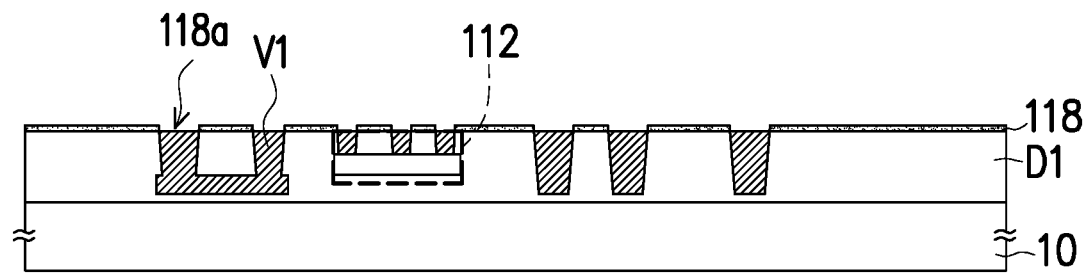

Next, referring to FIG. 1B, a barrier layer 118 may be formed on the first dielectric layer D1, for example, by a spin coating process, a plating process, a deposition process, a photolithography process, or other suitable manufacturing processes. Since the circuit that is to be formed on the transistor 112 may include metal ions (e.g., copper ions) having a high diffusion coefficient. If these metal atoms diffuse into the transistor 112, the characteristics of the transistor 112 may be easily degraded. Therefore, the barrier layer 118 is disposed to increase the electrical reliability and the bonding strength of the transistor 112. The material of the barrier layer 118 may include SiNx, SiOx, or TiNx. However, the embodiment of the disclosure is not limited thereto, and other barrier materials suitable for barring the metal ions (e.g., copper ions) may also be used in the embodiment of the disclosure. In some embodiments, the barrier layer 118 may have a plurality of openings 118a to expose a portion of the first conductive via V1 and the conductive material layer 1126 for subsequent electrical connection.

Figure 1C:
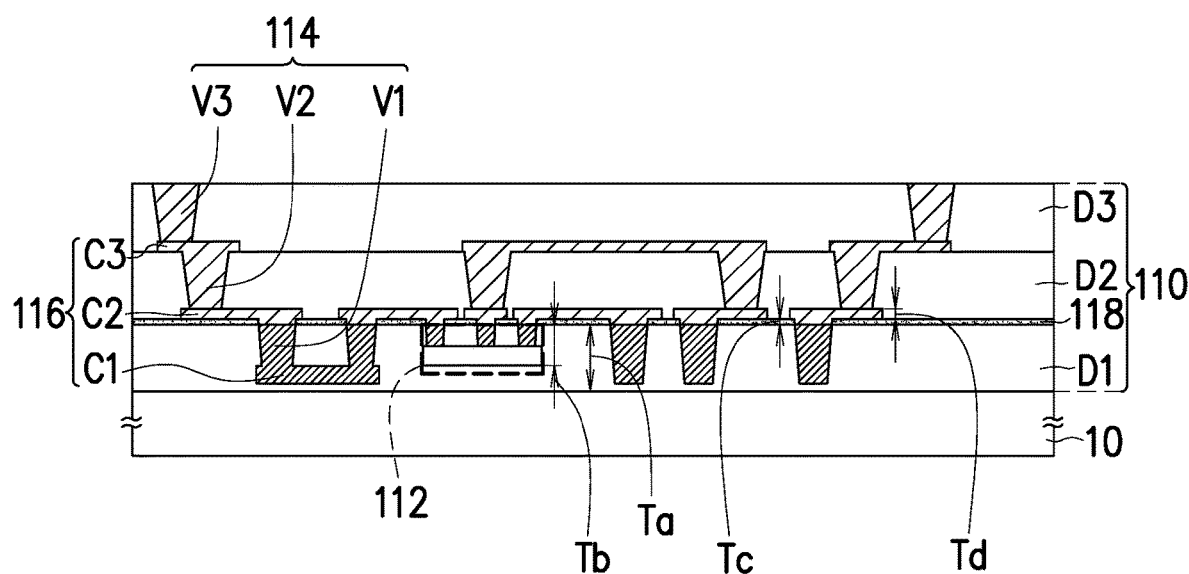

Referring to FIG. 1C, after the barrier layer 118 is formed, a second redistribution circuit C2, a second dielectric layer D2, a second conductive via V2, a third redistribution circuit C3, a third dielectric layer D3, and a third conductive via V3 may be formed alternately on the barrier layer 118. For example, a conductive material may be formed on the barrier layer 118 and in the opening 118a (refer to FIG. 1B), and the conductive material may be patterned to form the second redistribution circuit C2. In some embodiments, a dielectric material may be formed on the barrier layer 118 to cover the second redistribution circuit C2, and a portion of the dielectric material may be removed by laser drilling or other suitable manufacturing processes to form a plurality of openings, which expose a portion of the second redistribution circuit C2 to form the second dielectric layer D2. Thus, the barrier layer 118 is interposed between the first dielectric layer D1 and the second dielectric layer D2 and is located between the second redistribution circuit C2 and the semiconductor material layer 1122 (refer to FIG. 1A) of the transistor 112 to prevent the transistor 112 from being affected by the diffusion of the ions (e.g., copper ions) of the second redistribution circuit C2.

Thereafter, a conductive material may be formed in these openings to form the second conductive via V2. Then, the third redistribution circuit C3 may be formed on the second conductive via V2. In some embodiments, the second conductive via V2 and the third redistribution circuit C3 formed thereon may be manufactured in the same process. For example, a conductive material may be formed in the opening of the second dielectric layer D2 and on the second dielectric layer D2, and the conductive material may be patterned to form the third redistribution circuit C3 on the second dielectric layer D2. After the third redistribution circuit C3 is formed, the third dielectric layer D3 and the third conductive via V3 may be formed in a similar manner and thus details thereof will not be repeated hereinafter. The number of the redistribution circuits and the dielectric layers or the number of the conductive vias may be determined according to the actual design requirements, which may be one single layer or multiple layers. FIG. 1C is merely an example, and the embodiment of the disclosure is not limited thereto. In other embodiments, the barrier layer 118 may also be formed between the second dielectric layer D2 and the third dielectric layer D3 according to the design requirements. The embodiment of the disclosure is not intended to limit the number of the barrier layers 118 to be disposed.

Further, any (e.g., the first dielectric layer D1, the second dielectric layer D2, or the third dielectric layer D3) of the dielectric layers in the redistribution structure layer 110 of the embodiment has a thickness Ta. A total thickness of the second dielectric sub-layer D1-2 (refer to FIG. 1A) and the third dielectric sub-layer D1-3 (refer to FIG. 1A) where the transistor 112 is located is Tb, and the barrier layer 118 has a thickness Tc. In some embodiments, the thickness Ta of any of the dielectric layers is greater than the total thickness Tb of the second dielectric sub-layer D1-2 (refer to FIG. 1A) and the third dielectric sub-layer D1-3 where the transistor 112 is located. For example, the thickness Ta of any of the dielectric layers may be in a range of about 0.1 µm to about 20 µm, and the total thickness Tb may be in a range of about 500 nm to about 1000 nm. In some embodiments, the total thickness Tb of the second dielectric sub-layer D1-2 (refer to FIG. 1A) and the third dielectric sub-layer D1-3 where the transistor 112 is located is greater than the thickness Tc of the barrier layer 118. For example, the thickness Tc of the barrier layer 118 may be in a range of about 5 nm to about 500 nm. A thickness Td of any (e.g., the first redistribution circuit C1, the second redistribution circuit C2, or the third redistribution circuit C3) of the redistribution circuits 116 may be in a range of about 2 µm to about 8 µm. Regarding the manufacturing processes in the redistribution structure layer 110 of the embodiment, the manufacturing process for the transistor 112 that requires an environment of a relatively high temperature (e.g., about 300 degrees to 400 degrees) is performed first, and then the manufacturing process for the redistribution circuit 116 that is formed on the transistor 112 in an environment of a relatively low temperature (e.g., about 200 degrees) is performed, so as to prevent damaging the transistor 112 at the bottom.

Figure 1D:
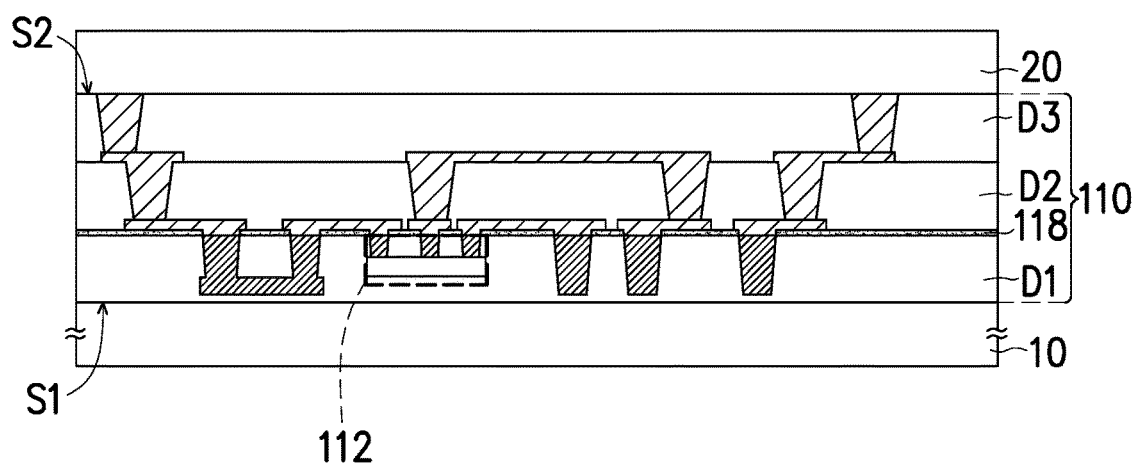
Figure 1E:
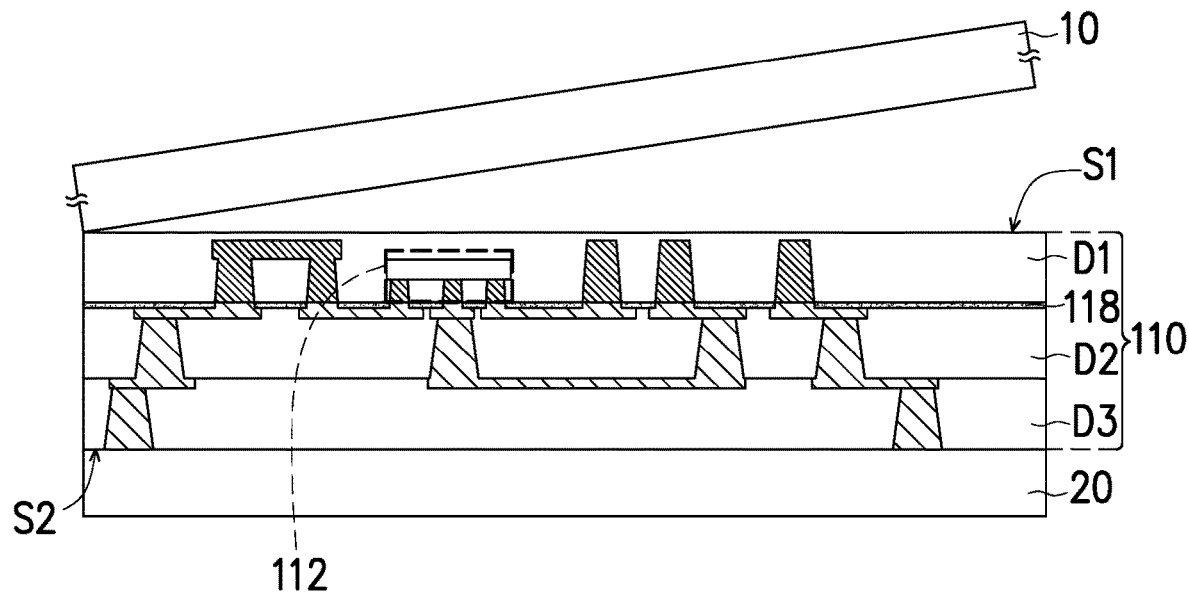

Next, referring to FIG. 1D and FIG. 1E, a protective film 20 is formed on the redistribution structure layer 110. For example, the redistribution structure layer 110 has a first side S1 and a second side S2 that are opposite to each other. The first side S1 may be in contact with the first carrier 10, and the transistor 112 and the first conductive via V1 are formed and located on the first side S1. The protective film 20 may be disposed on the second side S2 such that the redistribution structure layer 110 is located between the first carrier 10 and the protective film 20. For example, the protective film 20 may be sufficiently rigid to provide support in the subsequent processes. In some embodiments, the protective film 20 may include a release film to be stripped from the second side S2 of the redistribution structure layer 110 later. After the protective film 20 is formed, a stripping process and a substrate turning process may be performed. In some embodiments, the stripping process may be performed first to strip the first carrier 10 from the first side S1 of the redistribution structure layer 110 so as to expose a surface of the first dielectric layer D1, and then the substrate turning process is performed to flip the redistribution structure layer 110 upside down by 180 degrees, so that the first side S1 of the redistribution structure layer 110 faces upwardly to facilitate the subsequent processes on the first dielectric layer D1. In other embodiments, the substrate turning process may be performed before the stripping process, but the embodiment of the disclosure is not limited thereto.

Figure 1F:
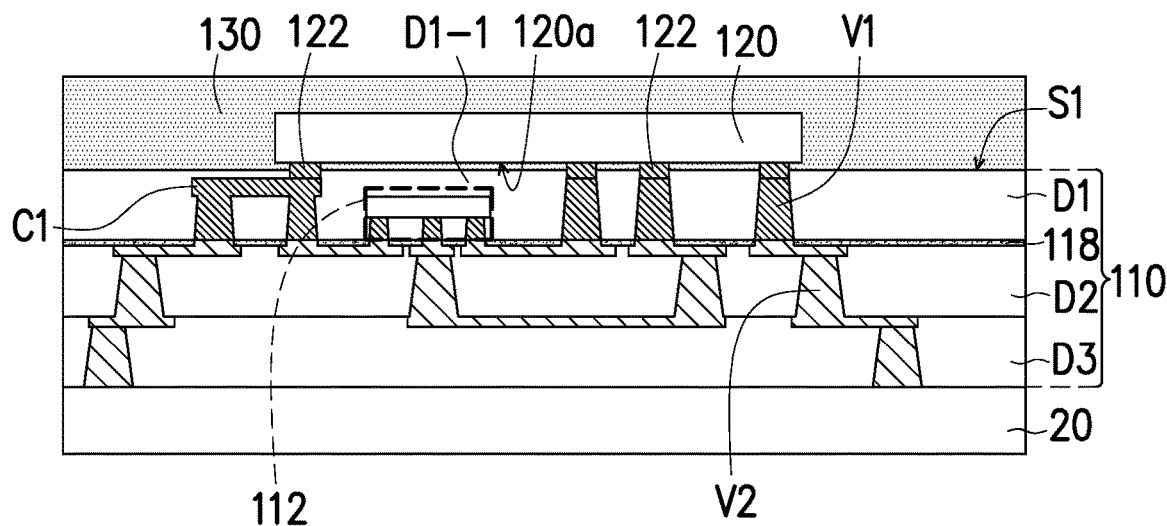

Referring to FIG. 1F, after the stripping process is performed, at least one chip 120 may be disposed on the first side S1 of the redistribution structure layer 110 to be close to the transistor 112. For example, a plurality of contact pads 122 may be disposed on an active surface 120a of the chip 120. The contact pads 122 of the chip 120 may be electrically connected to the first conductive via V1 and/or the first redistribution circuit C1 around the transistor 112 by a flip-chip process, so as to shorten the distance of electrical conductivity between the chip 120 and the transistor 112. In some embodiments, after the stripping process is completed, the first dielectric layer D1 (e.g., the first dielectric sub-layer D1-1 shown in FIG. 1A) covers the first conductive via V1 and the first redistribution circuit C1, and a plurality of openings may be formed on the first side S1 of the redistribution structure layer 110 (i.e. on the first dielectric layer D1) by laser drilling or other suitable manufacturing processes to expose the first conductive via V1 and/or the first redistribution circuit C1. Then, a highly conductive metal (e.g., tin) may be filled in the openings and electrically connected to the chip 120 so as to reduce the impedance of the chip 120 and the redistribution structure layer 110. In other embodiments, the chip 120 may be electrically connected to the redistribution structure layer 110 by solder balls or other suitable methods. Nevertheless, the manufacturing process of the embodiment of the disclosure is not limited thereto.

After disposing the chip 120, an encapsulant 130 may be formed on the first side S1 of the redistribution structure layer 110. For example, the encapsulant 130 may be formed by disposing a molding material (e.g. epoxy resin) or other suitable dielectric materials on the first side S1 of the redistribution structure layer 110 by a molding process, so as to at least encapsulate the chip 120 to isolate the chip 120 from the external environment. Nevertheless, the material and manufacturing process of the encapsulant 130 in the embodiment of the disclosure are not limited thereto.

Figure 1G:
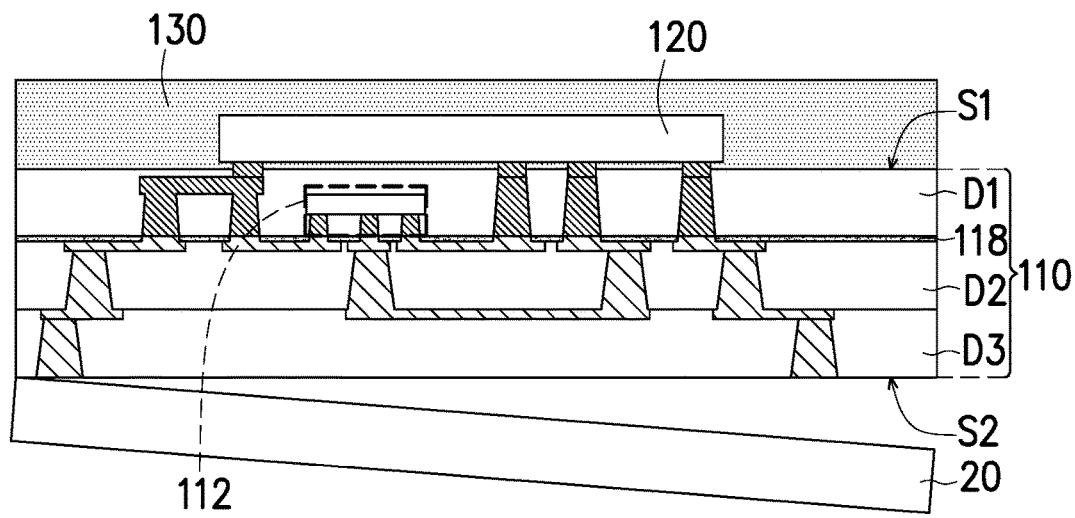
Figure 1H:
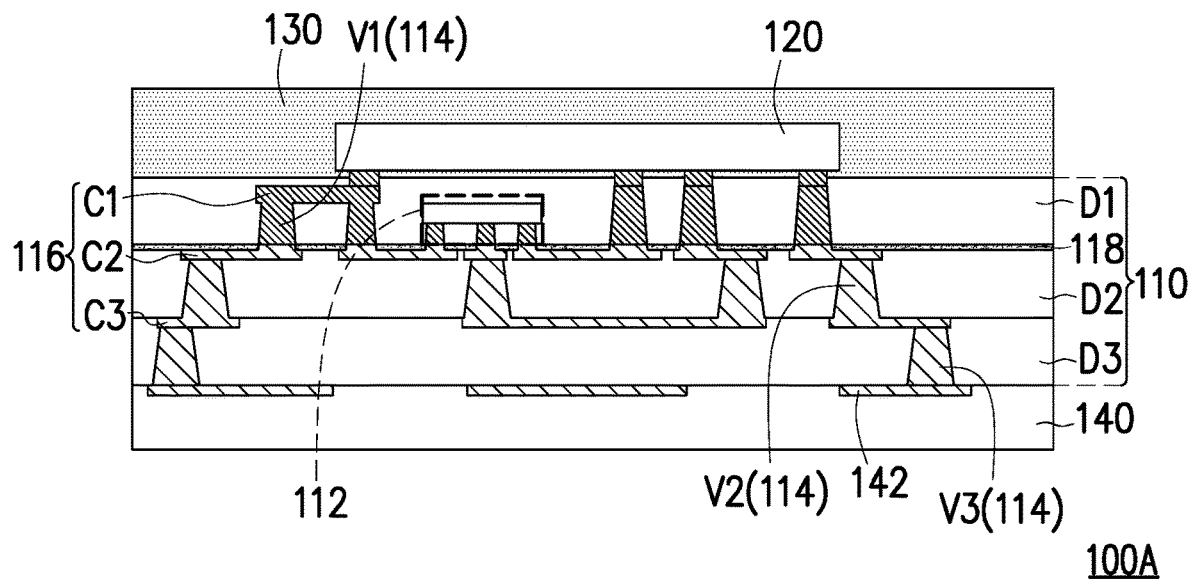

Referring to FIG. 1G and FIG. 1H, after forming the encapsulant 130, the protective film 20 may be optionally stripped from the second side S2 of the redistribution structure layer 110 to expose a surface of the third dielectric layer D3. Thereafter, a carrier board 140 is disposed on the second side S2 of the redistribution structure layer 110, wherein the carrier board 140 is electrically connected to the chip 120 via the conductive vias 114 of the redistribution structure layer 110. In some embodiments, the carrier board 140 may be a printed circuit board, a semiconductor integrated circuit board, or a semiconductor processed wafer substrate. However, the embodiment of the disclosure is not limited thereto. For example, the carrier board 140 may include a plurality of contact pads 142 thereon, and the contact pads 142 of the carrier board 140 may be bonded to the third conductive via V3 of the redistribution structure layer 110, so that the chip 120 is electrically connected to the carrier board 140 via the redistribution structure layer 110. At this point, the manufacturing processes of the chip package structure 100A are completed. For example, the chip package structure 100A may be completed in a panel-level package (PLP) process. That is, after the package process is completed in the panel stage, a plurality of individual chip package structures 100A may be obtained by cutting. In other embodiments, the chip package structure 100A may also be manufactured in a wafer level packaging (WLP) manner, but the disclosure is not limited thereto.

Figure 2:
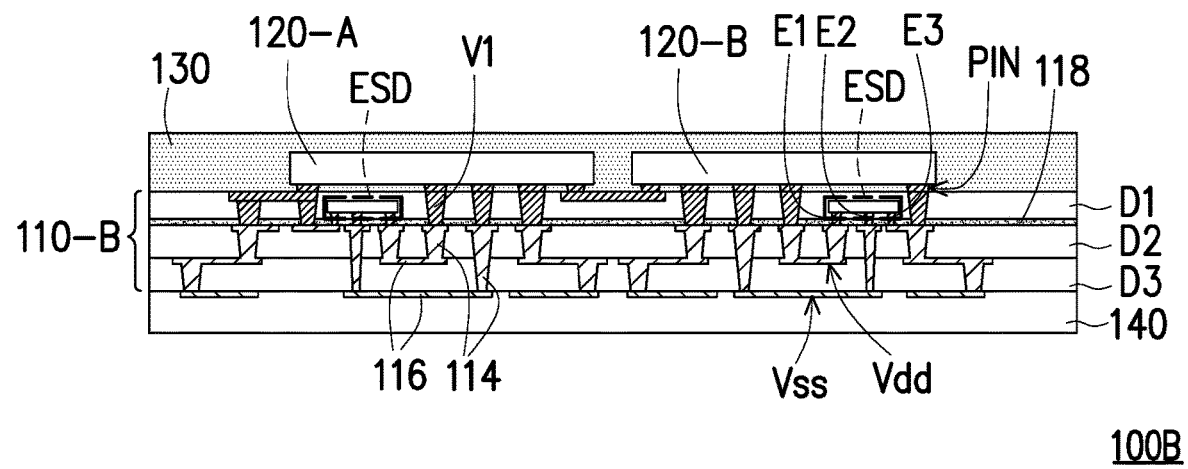
FIG. 2 is a schematic cross-sectional view of a chip package structure according to the second embodiment of the disclosure.

FIG. 2 is a schematic cross-sectional view of a chip package structure according to the second embodiment of the disclosure. A chip package structure 100B of this embodiment is similar to the chip package structure 100A of FIG. 1H. The same or similar reference numerals are used to represent the same or similar components. Therefore, the components that have been described with reference to FIG. 1A to FIG. 1H will not be described again hereinafter. Referring to FIG. 2, the chip package structure 100B includes chips 120-A and 120-B disposed on a redistribution structure layer 110-B, and the chips 120-A and 120-B may be electrically connected to each other via the redistribution structure layer 110-B. In some embodiments, the chips 120-A and 120-B may be chips that have the same function. In other embodiments, the chips 120-A and 120-B may have different functions. For example, the chips 120-A and 120-B include logic chips, memory chips, input/output chips, etc. However, the embodiment of the disclosure is not limited thereto. It should be understood that although two chips are shown in FIG. 2, in other embodiments, the number of the chips in the chip package structure may be more than two according to the design requirements, and the embodiment of the disclosure is not intended to limit the number of the chips.

In this embodiment, the transistor located in the first dielectric layer D1 may be a thin-film transistor (TFT) with an electrostatic discharge protection function (indicated as ESD in FIG. 2). For example, at least two electrostatic discharge protection transistors ESD may be disposed to be electrically connected to the chips 120-A and 120-B respectively via the redistribution structure layer 110-B. In some embodiments, the first conductive via V1 disposed around the electrostatic discharge protection transistor ESD and the conductive material layer 112b (refer to FIG. 1A) disposed on the electrostatic discharge protection transistor ESD may electrically connect the electrostatic discharge protection transistor ESD to the chips 120-A and 120-B via the redistribution circuit 116 and the conductive vias 114 in other layers. At least a part of the conductive vias 114 (including the first conductive via V1 or the conductive material layer 112b of the electrostatic discharge protection transistor ESD and the conductive vias in other layers) and at least a portion of the redistribution circuit 116 may constitute a voltage source line Vdd and a ground line Vss. In some embodiments, the chips 120-A and 120-B electrically connected to each other may share the voltage source line Vdd and the ground line Vss.

In some embodiments, at least one end of the chips 120-A and 120-B may be provided with an input/output (I/O) pins PIN. Electrostatic discharge may enter the chips via the pins PIN. In the embodiment of the disclosure, the electrostatic discharge protection transistor ESD is formed during formation of the redistribution structure layer 110-B, so as to prevent electrostatic discharge from damaging the functional circuits of the chips 120-A and 120-B. Moreover, in comparison with the traditional configuration with an electrostatic discharge protection device, the configuration according to the embodiment of the disclosure reduces, or significantly reduces the area occupied by the electrostatic discharge protection transistor in the chip package structure, and there is no need to dispose an interposer including an electrostatic discharge protection device, thereby the manufacturing costs may be reduced. For example, in the embodiment, the electrostatic discharge protection transistor ESD may be disposed on the side close to the chips 120-A and 120-B to easily release the electrostatic discharge current. In some embodiments, the electrostatic discharge protection transistor ESD has a first end E1 and a second end E2. In some embodiments, the electrostatic discharge protection transistor ESD further has a third end E3 electrically connected to the pins PIN of the chips 120-A and 120-B. It should be understood that, although the first end E1, the second end E2, and the third end E3 are sequentially arranged from left to right on the same side in FIG. 2, in other embodiments, the first end E1, the second end E2, and the third end E3 may be arranged in different orders or disposed on different sides of the electrostatic discharge protection transistor ESD according to the design requirements. For example, the first end E1 of the electrostatic discharge protection transistor ESD may be electrically connected to the voltage source line Vdd, and the second end E2 of the electrostatic discharge protection transistor ESD may be electrically connected to the ground line Vss, so as to introduce a surge current into the voltage source line Vdd and the ground line Vss to prevent damaging the chips 120-A and 120-B.

Figure 3:
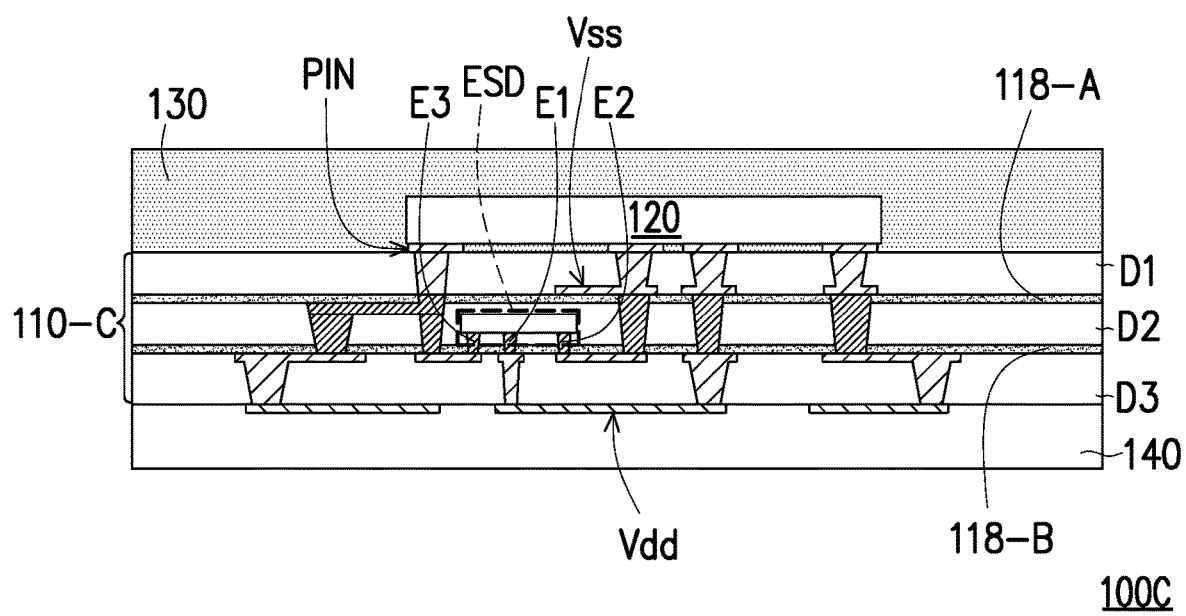
FIG. 3 is a schematic cross-sectional view of a chip package structure according to the third embodiment of the disclosure.

FIG. 3 is a schematic cross-sectional view of a chip package structure according to the third embodiment of the disclosure. A chip package structure 100C of this embodiment is similar to the chip package structure 100A of FIG. 1H and the chip package structure 100B of FIG. 2. The same or similar reference numerals are used to represent the same or similar components and therefore details thereof will not be repeated hereinafter. Referring to FIG. 3, in a redistribution structure layer 110-C of the chip package structure 100C, the electrostatic discharge protection transistor ESD is, for example, disposed in the second dielectric layer D2, and barrier layers 118-A and 118-B may be respectively disposed on two opposite sides of the second dielectric layer D2, so as to isolate the electrostatic discharge protection transistor ESD from the redistribution circuit 116 located on the other dielectric layers (e.g., the first dielectric layer D1 and/or the third dielectric layer D3).

For example, the barrier layer 118-A may be formed on the first carrier first, and then a transistor manufacturing process is performed on the barrier layer 118-A to form the electrostatic discharge protection transistor ESD, the second dielectric layer D2, and the redistribution circuit and conductive vias in the second dielectric layer D2. Next, the barrier layer 118-B is formed on the second dielectric layer D2, and then the third dielectric layer D3 and the redistribution circuit and the conductive vias in the third dielectric layer D3 are formed on the barrier layer 118-B. Then, after attaching the protective film, removing the first carrier, and performing a substrate turning process, the first dielectric layer D1 and the redistribution circuit and conductive vias in the first dielectric layer D1 are formed on the side of the second dielectric layer D2 opposite to the third dielectric layer D3 (i.e. formed over the barrier layer 118-A). Thereafter, the chip 120 is disposed on the first dielectric layer D1.

Then, the protective film is removed to bond a carrier board 150 to the third dielectric layer D3.

In the embodiment, the third end E3, the first end E1, and the second end E2 of the electrostatic discharge protection transistor ESD of FIG. 3 are sequentially arranged from left to right to be electrically connected to the pin PIN of the chip 120, the voltage source line Vdd, and the ground line Vss, respectively. In other embodiments, the chip package structure 100C may also be configured similar to the chip package structure of FIG. 2 that includes multiple chips, wherein the chips are electrically connected to each other via the redistribution structure layer 110-C.

Figure 4:
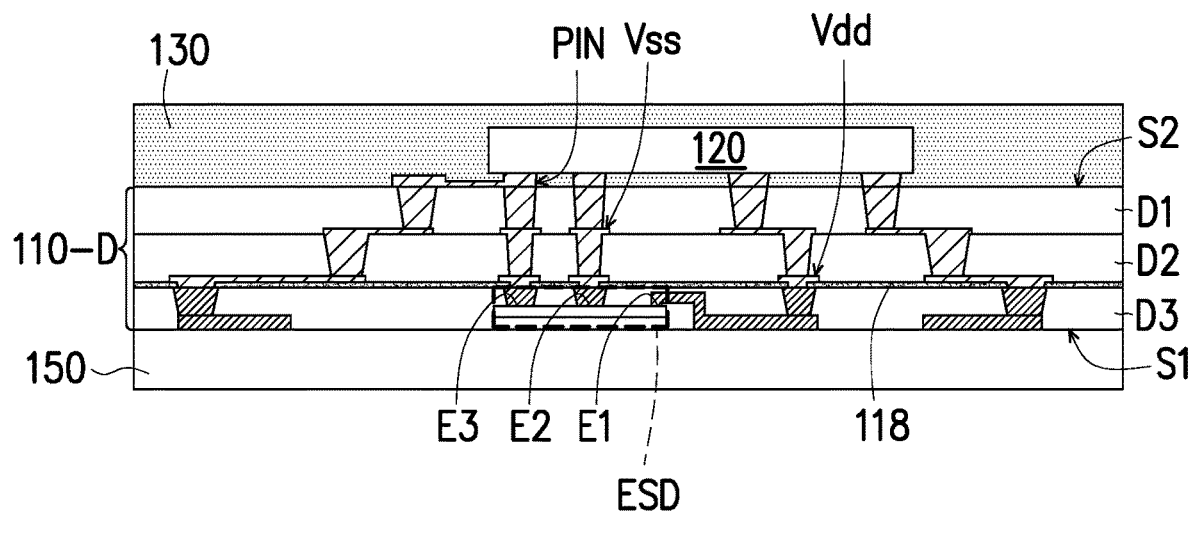
FIG. 4 is a schematic cross-sectional view of a chip package structure according to the fourth embodiment of the disclosure.

FIG. 4 is a schematic cross-sectional view of a chip package structure according to the fourth embodiment of the disclosure. Referring to FIG. 4, a redistribution structure layer 110-D of a chip package structure 100D of the embodiment may be disposed on the carrier board 150, and the electrostatic discharge protection transistor ESD is disposed in the third dielectric layer D3. For example, a transistor manufacturing process may be performed on the first carrier to form the electrostatic discharge protection transistor ESD, the third dielectric layer D3, and the redistribution circuit and the conductive vias in the third dielectric layer D3. Then, a barrier layer 118 is formed on the third dielectric layer D3. Next, the second dielectric layer D2 and the redistribution circuit and the conductive vias therein are formed on the barrier layer 118, and then the first dielectric layer D1 and the redistribution circuit and the conductive vias therein are formed on the second dielectric layer D2. Thereafter, the first carrier is removed for disposing the chip 120 and the carrier board 150 on the first dielectric layer D1 and the third dielectric layer D3, respectively. That is, in comparison with the method described with reference to FIG. 1A to FIG. 1H, the formation of the chip package structure 100D of the embodiment does not require a substrate turning process after the redistribution structure layer 110-D is formed. Therefore, in the embodiment, the electrostatic discharge protection transistor ESD is located on the first side S1 of the redistribution structure layer 110-D connected to the carrier board 150 and is away from the second side S2 where the chip 120 is located. For example, the carrier board 150 includes a glass substrate, a ceramic substrate, or other suitable carrier boards. The carrier board 150 may not have circuit lines therein. In some embodiments, the chip package structure 100D may also be configured similar to the chip package structure of FIG. 2 that includes multiple chips, wherein the chips are electrically connected to each other via the redistribution structure layer 110-D. In other embodiments, the carrier board 150 may be similar to the carrier board of FIG. 1H, and the contact pads on the carrier board are electrically connected to the redistribution structure layer 110-D directly. Details thereof will not be repeated hereinafter.

Figure 5:
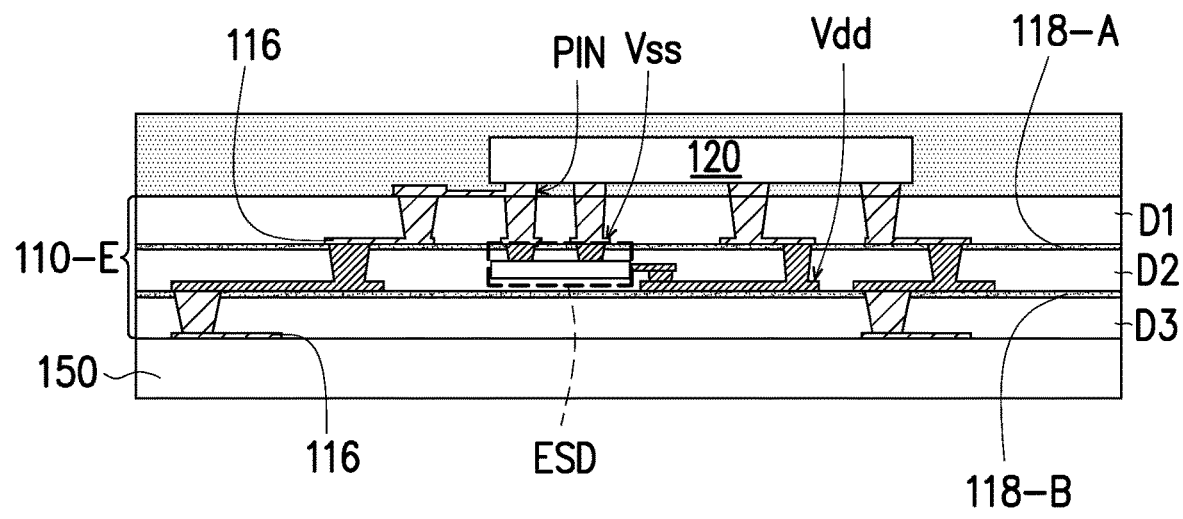
FIG. 5 is a schematic cross-sectional view of a chip package structure according to the fifth embodiment of the disclosure.

FIG. 5 is a schematic cross-sectional view of a chip package structure according to the fifth embodiment of the disclosure. A chip package structure 100E of this embodiment is similar to the chip package structure 100D of FIG. 4. The same or similar reference numerals are used to represent the same or similar components and therefore details thereof will not be repeated hereinafter. Referring to FIG. 5, a difference between the chip package structure 100E of this embodiment and the chip package structure 100D of FIG. 4 is for example that: in this embodiment, the electrostatic discharge protection transistor ESD is disposed in the second dielectric layer D2, and therefore the redistribution structure layer 110-E includes at least two barrier layers 118-A and 118-B that are respectively disposed on two opposite sides of the second dielectric layer D2 where the electrostatic discharge protection transistor ESD is located. A method of forming the chip package structure 100E of this embodiment is similar to the method of forming the chip package structure 100C of FIG. 3 and therefore details thereof will not be repeated hereinafter. In other embodiments, the chip package structure 100E may also be configured similar to the chip package structure of FIG. 2 that includes multiple chips, wherein the chips are electrically connected to each other via the redistribution structure layer 110-E.

Figure 6:
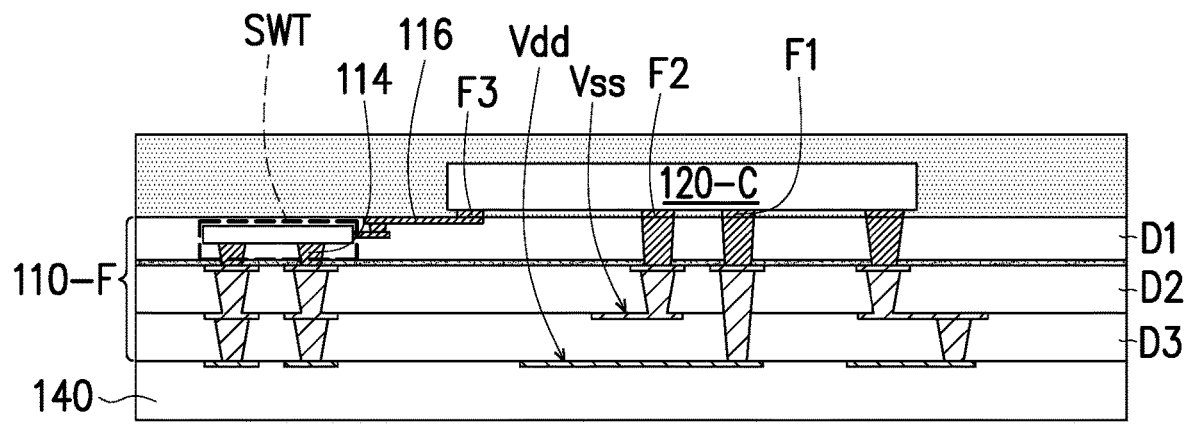
FIG. 6 is a schematic cross-sectional view of a chip package structure according to the sixth embodiment of the disclosure.

FIG. 6 is a schematic cross-sectional view of a chip package structure according to the sixth embodiment of the disclosure. A chip package structure 100F of this embodiment is similar to the chip package structure 100A of FIG. 1H. The same or similar reference numerals are used to represent the same or similar components and therefore details thereof will not be repeated hereinafter. Referring to FIG. 6, in the redistribution structure layer 110-F of the chip package structure 100F, the transistor in the first dielectric layer D1 may be a thin film transistor that has a switch control function (indicated as SWT in FIG. 6). The switch control transistor SWT may be electrically connected to a chip 120-C via the redistribution circuit 116 and/or the conductive vias 114, so as to adjust and select the input signal for the chip 120-C. For example, the chip 120-C may have a voltage source end F1 connected to the voltage source line Vdd in the redistribution structure layer 110-F, a ground end F2 connected to the ground line Vss in the redistribution structure layer 110-F, and a pin end F3 connected to the third end E3 of the switch control transistor SWT. In some embodiments, the switch control transistor SWT may be electrically connected to the pin end F3 of the chip 120-C via the redistribution circuit 116 in the first dielectric layer D1. In other embodiments, the chip package structure 100F may also be configured similar to the chip package structure of FIG. 2 that includes multiple chips, wherein the chips are electrically connected to each other via the redistribution structure layer 110-F, and these electrically connected chips, for example, may share the voltage source line Vdd and the ground line Vss.

Figure 7:
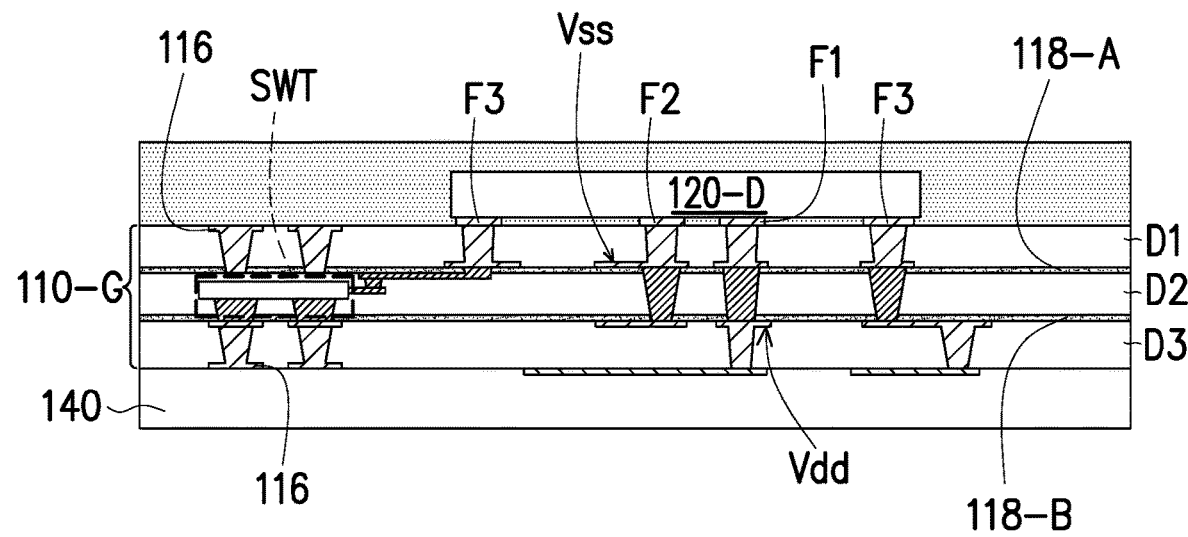
FIG. 7 is a schematic cross-sectional view of a chip package structure according to the seventh embodiment of the disclosure.

FIG. 7 is a schematic cross-sectional view of a chip package structure according to the seventh embodiment of the disclosure. A chip package structure 100G of this embodiment is similar to the chip package structure 100F of FIG. 6. The same or similar reference numerals are used to represent the same or similar components and therefore details thereof will not be repeated hereinafter. Referring to FIG. 7, a chip 120-D may have a plurality of pin ends F3, and one of the pin ends F3 may be electrically connected to the switch control transistor SWT. In a redistribution structure layer 110-G of the chip package structure 100G of this embodiment, the switch control transistor SWT is, for example, formed in the second dielectric layer D2, and barrier layers 118-A and 118-B may be respectively disposed on two opposite sides of the second dielectric layer D2, so as to isolate the switch control transistor SWT from the redistribution circuits 116 disposed in other dielectric layers (e.g., the first dielectric layer D1 and/or the third dielectric layer D3). In other embodiments, the chip package structure 100G may also be configured similar to the chip package structure of FIG. 2 that includes multiple chips, wherein the chips are electrically connected to each other via the redistribution structure layer 110-G, and these electrically connected chips may, for example, share the voltage source line Vdd and the ground line Vss.

Figure 8:
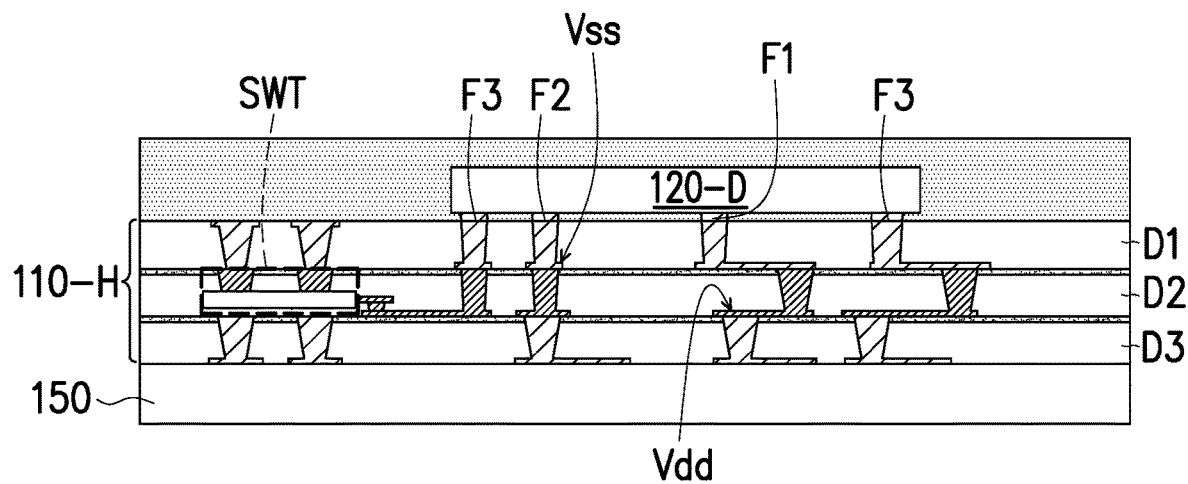
FIG. 8 is a schematic cross-sectional view of a chip package structure according to the eighth embodiment of the disclosure.

FIG. 8 is a schematic cross-sectional view of a chip package structure according to the eighth embodiment of the disclosure. A chip package structure 100H of this embodiment is similar to the chip package structure 100G of FIG. 7. The same or similar reference numerals are used to represent the same or similar components and therefore details thereof will not be repeated hereinafter. Referring to FIG. 8, the chip package structure 100H of this embodiment may be similar to the chip package structure 100G of FIG. 7 in that a redistribution structure layer 110-H is formed on the carrier board 150. In other words, the redistribution structure layer 110-H may be formed on the carrier board 150 by the method described with reference to FIG. 1A to FIG. 1C, and then the chip 120-D is disposed on the redistribution structure layer 110-H without attaching a protective film or performing a substrate turning process and a stripping process. Therefore, in this embodiment, the position of the switch control transistor SWT in the second dielectric layer D2 is on the side close to the carrier board 150, and in the embodiment shown in FIG. 7, the position of the switch control transistor SWT in the second dielectric layer D2 is on the side close to the chip 120-D. In other embodiments, the chip package structure 100H may also be configured similar to the chip package structure of FIG. 2 that includes multiple chips, wherein the chips are electrically connected to each other via the redistribution structure layer 110-H, and these electrically connected chips may, for example, share the voltage source line Vdd and the ground line Vss.

Figure 9:
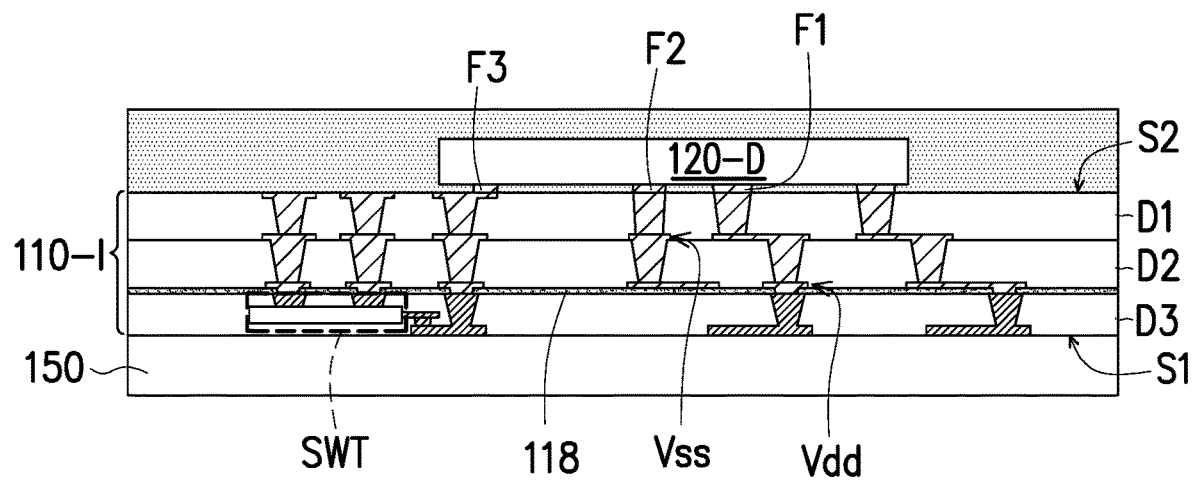
FIG. 9 is a schematic cross-sectional view of a chip package structure according to the ninth embodiment of the disclosure.

FIG. 9 is a schematic cross-sectional view of a chip package structure according to the ninth embodiment of the disclosure. A chip package structure 100I of this embodiment is similar to the chip package structure 100H of FIG. 8. The same or similar reference numerals are used to represent the same or similar components and therefore details thereof will not be repeated hereinafter. Referring to FIG. 9, the switch control transistor SWT in the chip package structure 100I is located on the first side S1 of the redistribution structure layer 110-I connected to the carrier board 150, and is away from the second side S2 where the chip 120-D is located. A difference between the chip package structure 100I of this embodiment and the chip package structure 100H of FIG. 8 lies in that one single barrier layer 118 is disposed in the chip package structure 100I of this embodiment.

Figure 10:
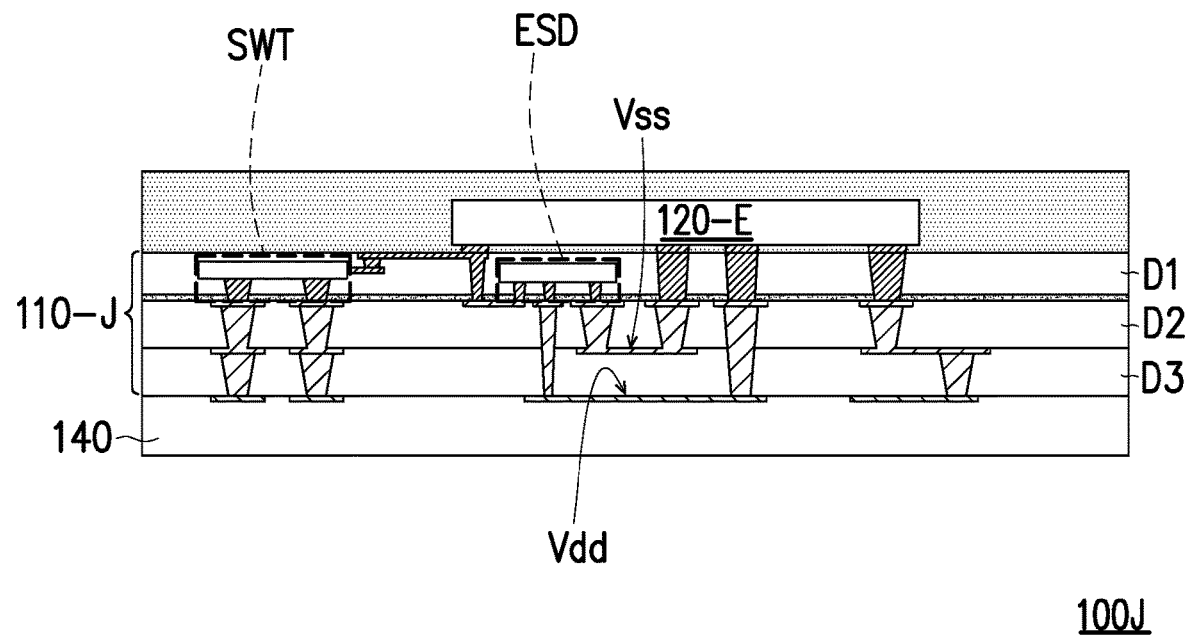
FIG. 10 is a schematic cross-sectional view of a chip package structure according to the tenth embodiment of the disclosure.

FIG. 10 is a schematic cross-sectional view of a chip package structure according to the tenth embodiment of the disclosure. Referring to FIG. 10, a chip package structure 100J of this embodiment includes a plurality of transistors that have different functions, such as the electrostatic discharge protection transistor ESD and the switch control transistor SWT. The chip package structure 100J of this embodiment is configured similar to a combination of the chip package structure 100F of FIG. 6 and the chip package structure 100A of FIG. 1H. The electrostatic discharge protection transistor ESD and the switch control transistor SWT may both be disposed in the dielectric layer on the side close to the chip 120-E. Details thereof will not be repeated hereinafter. Through the electrostatic discharge protection transistor ESD, the chip package structure 100J may prevent damage caused by instant influx of a large amount of electrostatic discharge current without increasing the size of the structure and the complexity of the manufacturing processes, and the chip package structure 100J may use the switch control transistor SWT to adjust and select the input signal for the chip 120-E. In other embodiments, the chip package structure 100J may also be configured similar to the chip package structure of FIG. 2 that includes multiple chips, wherein the chips are electrically connected to each other via the redistribution structure layer 110-J, and these electrically connected chips may, for example, share the voltage source line Vdd and the ground line Vss.

Figure 11:
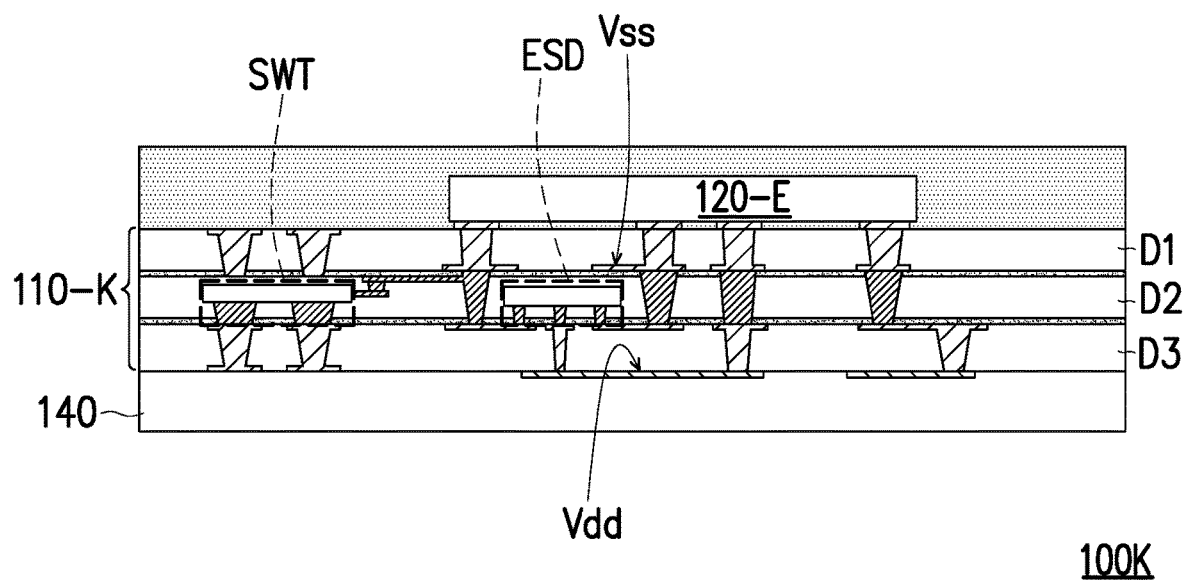
FIG. 11 is a schematic cross-sectional view of a chip package structure according to the eleventh embodiment of the disclosure.

FIG. 11 is a schematic cross-sectional view of a chip package structure according to the eleventh embodiment of the disclosure. A chip package structure 100K of this embodiment is similar to the chip package structure 100J of FIG. 10. The same or similar reference numerals are used to represent the same or similar components and therefore details thereof will not be repeated hereinafter. Referring to FIG. 11, the chip package structure 100K is configured similar to a combination of the chip package structure 100C of FIG. 3 and the chip package structure 100G of FIG. 7. The electrostatic discharge protection transistor ESD and the switch control transistor SWT may both be disposed in the second dielectric layer D2, and the barrier layers 118-A and 118-B may be respectively disposed on two opposite sides of the second dielectric layer D2. Details thereof will not be repeated hereinafter. In other embodiments, the chip package structure 100K may also be configured similar to the chip package structure of FIG. 2 that includes multiple chips, wherein the chips are electrically connected to each other via the redistribution structure layer 110-K, and these electrically connected chips may, for example, share the voltage source line Vdd and the ground line Vss.

Figure 12:
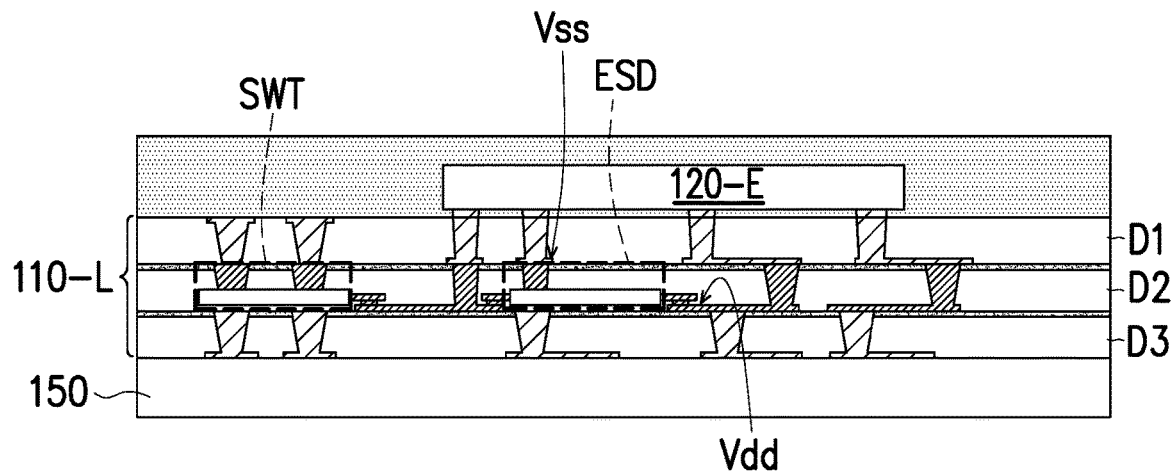
FIG. 12 is a schematic cross-sectional view of a chip package structure according to the twelfth embodiment of the disclosure.

FIG. 12 is a schematic cross-sectional view of a chip package structure according to the twelfth embodiment of the disclosure. Referring to FIG. 12, a chip package structure 100L of this embodiment is similar to the chip package structure 100K of FIG. 11. The same or similar reference numerals are used to represent the same or similar components and therefore details thereof will not be repeated hereinafter. Referring to FIG. 12, the chip package structure 100L is configured like a combination of the chip package structure 100E of FIG. 5 and the chip package structure 100H of FIG. 8. The electrostatic discharge protection transistor ESD and the switch control transistor SWT may both be disposed in the second dielectric layer D2 on the side close to the carrier board 150. Details thereof will not be repeated hereinafter. In other embodiments, the chip package structure 100L may also be configured similar to the chip package structure of FIG. 2 that includes multiple chips, wherein the chips are electrically connected to each other via the redistribution structure layer 110-L, and these electrically connected chips may, for example, share the voltage source line Vdd and the ground line Vss.

Figure 13:
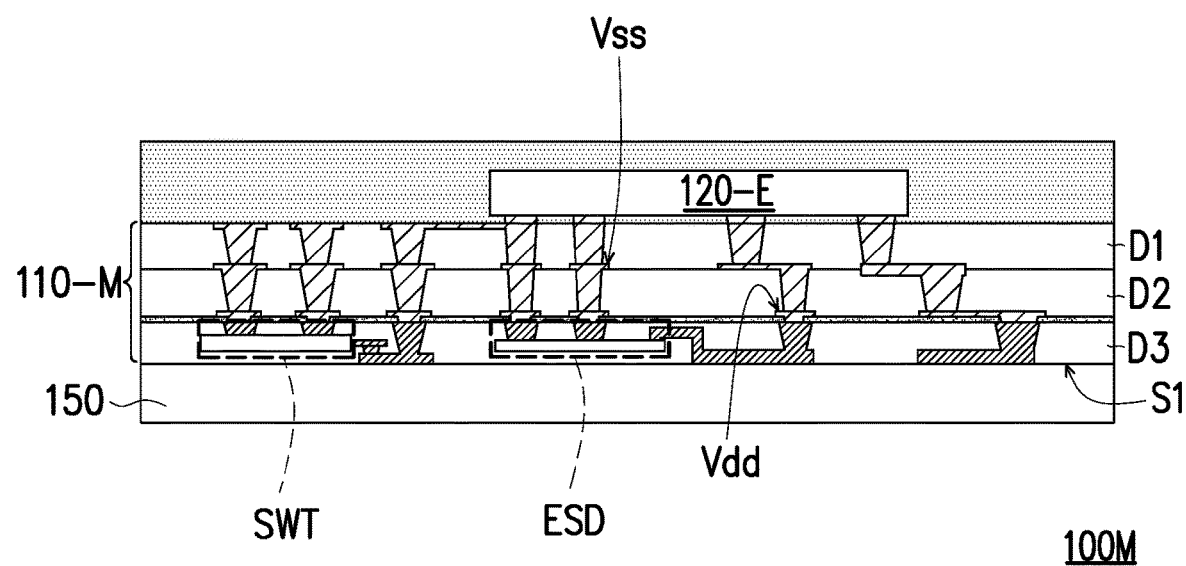
FIG. 13 is a schematic cross-sectional view of a chip package structure according to the thirteenth embodiment of the disclosure.

FIG. 13 is a schematic cross-sectional view of a chip package structure according to the thirteenth embodiment of the disclosure. Referring to FIG. 13, a chip package structure 100M of this embodiment is similar to the chip package structure 100L of FIG. 12. The same or similar reference numerals are used to represent the same or similar components and therefore details thereof will not be repeated hereinafter. Referring to FIG. 13, the chip package structure 100M is configured similar to a combination of the chip package structure 100D of FIG. 4 and the chip package structure 100I of FIG. 9. The electrostatic discharge protection transistor ESD and the switch control transistor SWT may both be disposed on the first side S1 connected to the carrier board 150. Details thereof will not be repeated hereinafter. In other embodiments, the chip package structure 100M may also be configured similar to the chip package structure of FIG. 2 that includes multiple chips, wherein the chips are electrically connected to each other via the redistribution structure layer 110-M, and these electrically connected chips may, for example, share the voltage source line Vdd and the ground line Vss.

Based on the above, in the design of the chip package structure according to the embodiments of the disclosure, the redistribution structure layer at least includes the redistribution circuit, the transistor, and the conductive vias. The transistor and the chip are electrically connected, which provides a function of electrostatic discharge protection and/or functions of adjusting and selecting the input signal for the chip, thereby simplifying the manufacturing processes, reducing the package size and thickness, and lowering the manufacturing costs.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A chip package structure, comprising:
    a redistribution structure layer, comprising:
        at least one redistribution circuit;
        at least one transistor electrically connected to the at least one redistribution circuit;
        a plurality of conductive vias electrically connected to the at least one redistribution circuit and the at least one transistor; and
        a plurality of dielectric layers, wherein one of the dielectric layers comprises a first dielectric sub-layer, a second dielectric sub-layer, and a third dielectric sub-layer stacked sequentially, the at least one transistor is located in the dielectric layers, and the at least one transistor comprises:
            a semiconductor material layer located in the second dielectric sub-layer;
            a metal material layer located in the third dielectric sub-layer; and
            a conductive material layer penetrating through the third dielectric sub-layer and the second dielectric sub-layer to connect the semiconductor material layer, and the conductive material layer surrounding the metal material layer;
    at least one chip disposed on the redistribution structure layer and electrically connected to the redistribution structure layer; and
    an encapsulant disposed on the redistribution structure layer and at least encapsulating the at least one chip.

2. The chip package structure according to claim 1, wherein the semiconductor material layer comprises a polysilicon semiconductor layer, a metal oxide semiconductor layer, or an amorphous silicon semiconductor layer.

3. The chip package structure according to claim 1, wherein the redistribution structure layer further comprises:
    at least one barrier layer disposed between the at least one redistribution circuit and the semiconductor material layer of the at least one transistor.

4. The chip package structure according to claim 3, wherein a thickness of one of the dielectric layers is greater than a total of a thickness of the second dielectric sub-layer and a thickness of the third dielectric sub-layer, and the total of the thickness of the second dielectric sub-layer and the thickness of the third dielectric sub-layer is greater than a thickness of the at least one barrier layer.

5. The chip package structure according to claim 4, wherein the thickness of the at least one barrier layer is in a range of 5 nm to 500 nm.

6. The chip package structure according to claim 4, wherein the thickness of one of the dielectric layers is in a range of 0.1 μm to 20 μm.

7. The chip package structure according to claim 3, wherein a material of the at least one barrier layer comprises SiNx, SiOx, or TiNx.

8. The chip package structure according to claim 1, wherein the at least one transistor has a first end and a second end, and the at least one redistribution circuit comprises a voltage source line and a ground line, the first end of the at least one transistor is electrically connected to the voltage source line, and the second end of the at least one transistor is electrically connected to the ground line.

9. The chip package structure according to claim 1, further comprising:
    a carrier board, the at least one chip and the carrier board respectively located on two opposite sides of the redistribution structure layer, wherein the carrier board is electrically connected to the at least one chip via the conductive vias of the redistribution structure layer.

10. The chip package structure according to claim 1, wherein a thickness of the at least one redistribution circuit is in a range of 2 μm to 8 μm.

11. The chip package structure according to claim 1, wherein the at least one transistor comprises an electrostatic discharge protection transistor or a switch control transistor.

* * * * *